US012677613B2

(12) United States Patent
Cheng et al.

(10) Patent No.: US 12,677,613 B2
(45) Date of Patent: Jul. 7, 2026

(54) HEAT DISSIPATION FOR FIELD EFFECT TRANSISTORS

(71) Applicant: Taiwan Semiconductor Manufacturing Company, Ltd., Hsinchu (TW)

(72) Inventors: Kai-Fang Cheng, Taoyuan District (TW); Hsiao-Kang Chang, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 365 days.

(21) Appl. No.: 18/402,992

(22) Filed: Jan. 3, 2024

(65) Prior Publication Data

US 2025/0118548 A1 Apr. 10, 2025

Related U.S. Application Data

(60) Provisional application No. 63/588,533, filed on Oct. 6, 2023.

(51) Int. Cl.
| | |
|---|---|
| H10P 14/692 | (2026.01) |
| H10D 30/47 | (2025.01) |
| H10P 14/20 | (2026.01) |
| H10P 14/60 | (2026.01) |

(52) U.S. Cl.
CPC ... H10P 14/69391 (2026.01); H10D 30/4732 (2025.01); H10P 14/3414 (2026.01); H10P 14/6329 (2026.01); H10P 14/6514 (2026.01); H10P 14/6538 (2026.01); H10P 14/662 (2026.01)

(58) Field of Classification Search
CPC .......... H10P 14/69391; H10P 14/3414; H10P 14/6329; H10P 14/6514; H10P 14/6538; H10P 14/662; H10P 14/3216; H10P 14/3252; H10P 14/3416; H10D 30/4732; H10D 30/015; H10D 30/475
See application file for complete search history.

(56) References Cited

U.S. PATENT DOCUMENTS

| | | | |
|---|---|---|---|
| 10,014,402 B1 | 7/2018 | Chen | |
| 10,109,729 B2 | 10/2018 | Liu | |
| 11,594,413 B2 | 2/2023 | Chen | |
| 2016/0233328 A1* | 8/2016 | Cheng ................ H10D 30/4755 |
| 2024/0304702 A1* | 9/2024 | Bothe ................. H10D 30/015 |

FOREIGN PATENT DOCUMENTS

| | | |
|---|---|---|
| CN | 103137476 A | 6/2013 |
| TW | 201314744 A | 4/2013 |

* cited by examiner

*Primary Examiner* — Karen Kusumakar
(74) *Attorney, Agent, or Firm* — HAYNES AND BOONE, LLP

(57) ABSTRACT

Semiconductor devices and methods of forming the same are provided. A method of the present disclosure includes depositing an aluminum nitride layer over a substrate, treating the aluminum nitride layer to convert a top portion of the aluminum nitride layer to an aluminum oxynitride layer, depositing a III-V semiconductor layer on the aluminum oxynitride layer, and forming a gate structure over the III-V semiconductor layer.

20 Claims, 18 Drawing Sheets

14B

108 — DEPOSIT A BUFFER LAYER

110 — DEPOSIT A LEAKAGE REDUCTION LAYER OVER THE BUFFER LAYER

112 — HAS THE DESIRED THICKNESS BEEN REACHED?

No

Yes

PROCEED TO BLOCK 16 IN METHOD 100

HEAT DISSIPATION FOR FIELD EFFECT TRANSISTORS

PRIORITY DATA

This application claims priority to U.S. Provisional Patent Application No. 63/588,533, filed on Oct. 6, 2023, which is hereby incorporated herein by reference in its entirety.

BACKGROUND

In semiconductor technology, due to their characteristics, Group III-Group V (or III-V) semiconductor compounds are used to form various integrated circuit devices, such as high power field-effect transistors, high frequency transistors, or high electron mobility transistors (HEMTs). An HEMT is a field effect transistor incorporating a junction between two materials with different band gaps (i.e., a heterojunction) as the channel instead of a doped region, as is generally the case for metal oxide semiconductor field effect transistors (MOSFETs). In contrast with MOSFETs, HEMTs have a number of attractive properties including high electron mobility and the ability to transmit signals at high frequencies.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 4-18 illustrate fragmentary cross-sectional views of a workpiece undergoing different operations of the method in FIG. 1, according to one or more aspects of the present disclosure.

DETAILED DESCRIPTION

Figure 1:
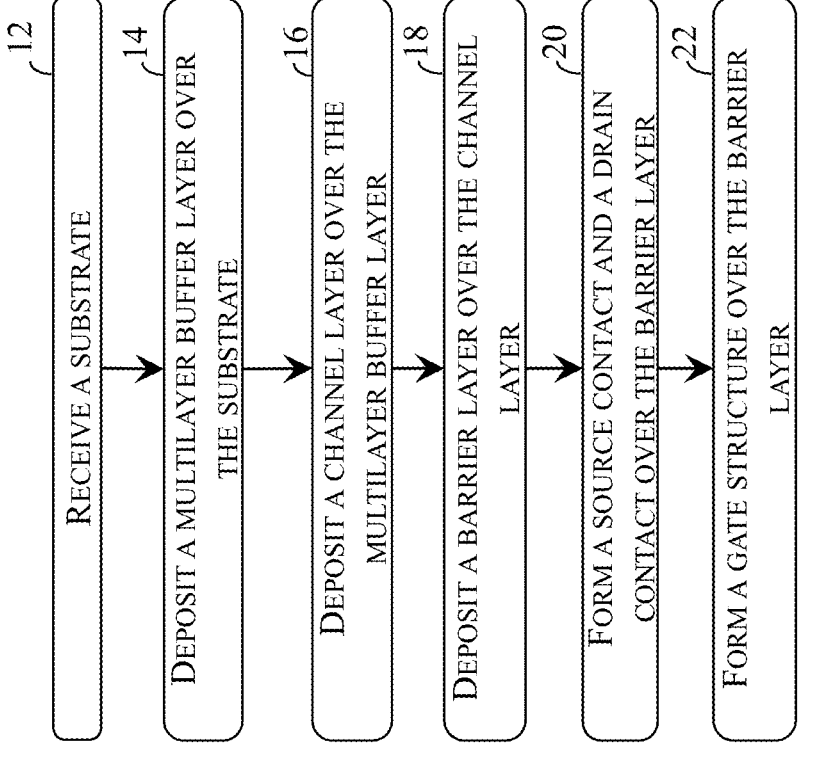
FIG. 1 illustrates a flow chart of a method for forming a device with improvement thermal dissipation, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. When describing aspects of a transistor, source/drain region(s) may refer to a source or a drain, individually or collectively, dependent upon the context.

High Electron Mobility Transistors (HEMTs) are a type of solid state transistors. Typically, HEMTs are fabricated to have an Aluminum Gallium Nitride/Gallium Nitride (AlGaN/GaN) structure wherein a 2-dimensional Electron Gas (2-DEG) with high electron mobility is formed at the AlGaN/GaN interface. HEMTs are used for high frequency, high temperature and high power applications. While HEMTs thrive in high frequency, high temperature and high power applications, they are subject to self-heating effect due to resistance (R) in the channel. The self-heating effect may accelerate device aging, degrade the drain saturation current, and cause a variety of reliability problem. The self-heating effect may increase the channel temperature due to Joule heating. When the lattice in the channel heats up and the heat cannot be effectively dissipated, both carrier mobility and electron saturation velocity may drop because of phonon scattering. An HEMT includes one or more buffer layers to interface the underlying substrate, which may serve as a heat sink for heat dissipation purposes. When the buffer layers have low thermal conductivity, heat from the self-heating effect cannot be effectively dissipated. Thermal conductivity of the buffer layer(s) thus plays an important role in heat dissipation of an HEMT. Generally speaking, a buffer layer with greater crystallinity tends to be a greater heat conductor. However, a greater crystallinity may also lead to greater leakage of electrons in the 2-DEG in the HEMT. Thus, it is desired to have a low-leakage, highly thermally conductive buffer layer in an HEMT.

The present disclosure provides a multilayer buffer layer to better dissipate heat from an HEMT without undesirable leakage of electrons. In one embodiments, a base buffer layer is deposited on a substrate and a treatment is performed to the base buffer layer to convert a top portion of the base buffer layer into a leakage reduction layer. The base buffer layer may include aluminum nitride and the leakage reduction layer may include aluminum oxynitride. In another embodiment, a buffer layer and a leakage reduction layer are alternatingly deposited over the substrate to form a multilayer buffer layer. The buffer layer may include aluminum nitride (AlN) or boron nitride (BN). The leakage reduction layer may include aluminum oxynitride (AlON) or gallium nitride (GaN). The base buffer layer or the buffer layer is deposited to have good crystallinity in order to exhibit good thermal conductivity. The leakage reduction layer keeps the electron leakage in check. The base buffer layer (or buffer layer) and the leakage reduction layer may be deposited in pairs to have a multilayer structure that conducts heat well and has low leakage.

The various aspects of the present disclosure will now be described in more detail with reference to the figures. FIG. 1 includes flowcharts of method 10 for forming a semiconductor device according to embodiments of the present disclosure. Operations at block 14 of method 10 may be performed using a sub-process 14A shown in FIG. 2 or a sub-process 14B shown in FIG. 3. Method 10 is merely examples and is not intended to limit the present disclosure to what is explicitly illustrated in method 10. Additional steps can be provided before, during and after method 10, and some steps described can be replaced, eliminated, or moved around for additional embodiments of the methods. Not all steps are described herein in detail for reasons of simplicity. Method 10, as well as the sub-processes 14A and 14B, are described below in conjunction with FIGS. 4-18, which include fragmentary cross-sectional views of a workpiece 200 at different stages of fabrication according to embodiments of method 10. For avoidance of doubts, throughout the figures, the X direction is perpendicular to the Y direction and the Z direction is perpendicular to both the X direction and the Y direction. Because the workpiece 200 will be formed into a semiconductor device upon conclusion of its fabrication process, the workpiece 200 may be referred to as a semiconductor device 200 or a semiconductor structure 200 as the context requires.

Figure 4:
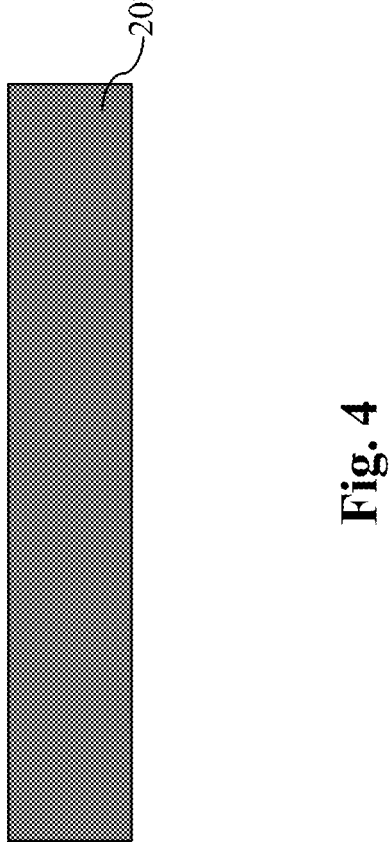
Figure 4:
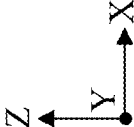

Referring to FIGS. 1 and 4, method 10 includes a block 12 where a substrate 202 is received. In some embodiments, the substrate 202 may be a silicon substrate, a silicon carbide substrate, or a sapphire substrate. When the substrate 202 is a silicon substrate, the substrate 202 may have a (111) lattice plane. The substrate 202 may be doped to reduce electron concentration near a top surface of the substrate 202. In some embodiments, the substrate 202 is doped with a p-type dopant, such as boron (B), aluminum (Al), gallium (Ga), indium (In), or boron difluoride (BF$_2$). The p-type dopant may be introduced by ion implantation. To repair the damages or defects caused by the ion implantation and to activate the p-type dopant, the substrate 202 may be subject to an anneal process at a temperature between about 800° C. and about 1100° C. The reduced electron concentration allows a higher operating voltage without damaging the semiconductor device 200.

In some embodiment not explicitly shown in the figures, a seed layer may be deposited over the substrate 202 before the buffer layer is deposited over the substrate 202 at block 14. The seed layer functions to bridge the lattice mismatch between the substrate 202 and the buffer layer. The seed layer may include a single layer or a multilayer. In some embodiments, the seed layer includes aluminum nitride (AlN). The seed layer may be epitaxially deposited on the substrate 202 using metal organic CVD (MOCVD), molecular beam epitaxy (MBE), vapor phase epitaxy (VPE), atomic layer deposition (ALD), or physical vapor deposition (PVD). To compensate for the lattice mismatch, the seed layer may include a gradual change in lattice structure, changing from a lattice structure closer to the substrate 202 to a lattice structure closer to the buffer layer. In some embodiments, the seed layer may be in-situ doped with an impurity to improve the seed layer's ability to prevent out-diffusion of the substrate 202. In one embodiment, the seed layer may be doped with carbon (C).

Referring to FIGS. 1-3, 5-7, and 12-14, method 10 includes a block 14 wherein a buffer layer is deposited over the substrate 202. Operations at block 14 may be performed according to a first sub-process 14A shown in FIG. 2 or a second sub-process 14B shown in FIG. 3. Both of the first sub-process 14A and the second sub-process 14B form a multilayer buffer layer. The first sub-process 14A deposits a base buffer layer and then treats the base buffer layer to convert a top portion of the base buffer layer to a leakage reduction layer. The deposition and treatment may be repeated until a desired thickness is reached. The second sub-process 14B deposits a buffer layer and then deposits a leakage reduction layer on the buffer layer. The depositions of the buffer layer and the leakage reduction layer may be repeated until a desired thickness is achieved.

Figure 2:
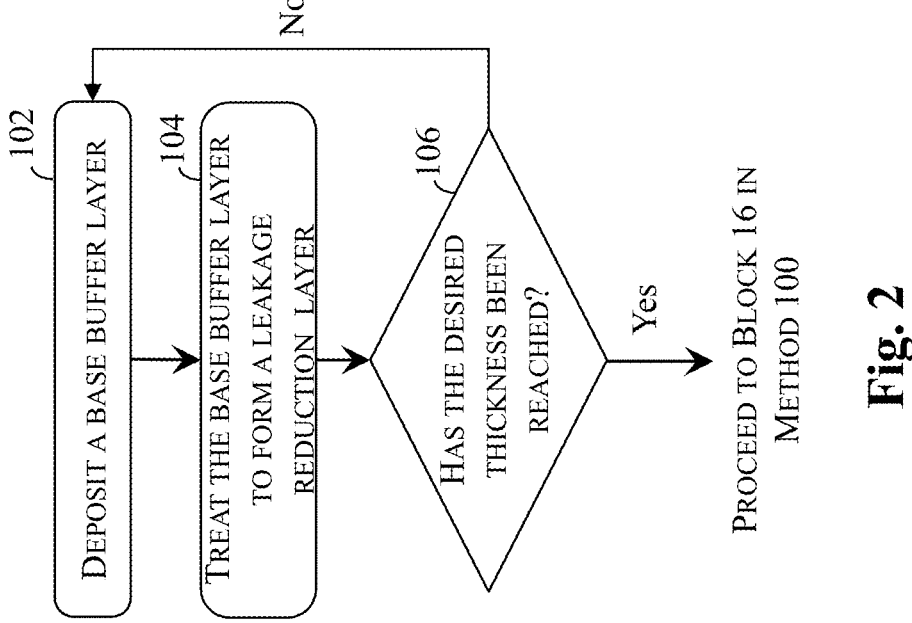
FIG. 2 illustrates a flow chart of a first sub-process for depositing a buffer layer at block 14 of the method in FIG. 1, according to one or more aspects of the present disclosure.
Figure 2:
Figure 5:
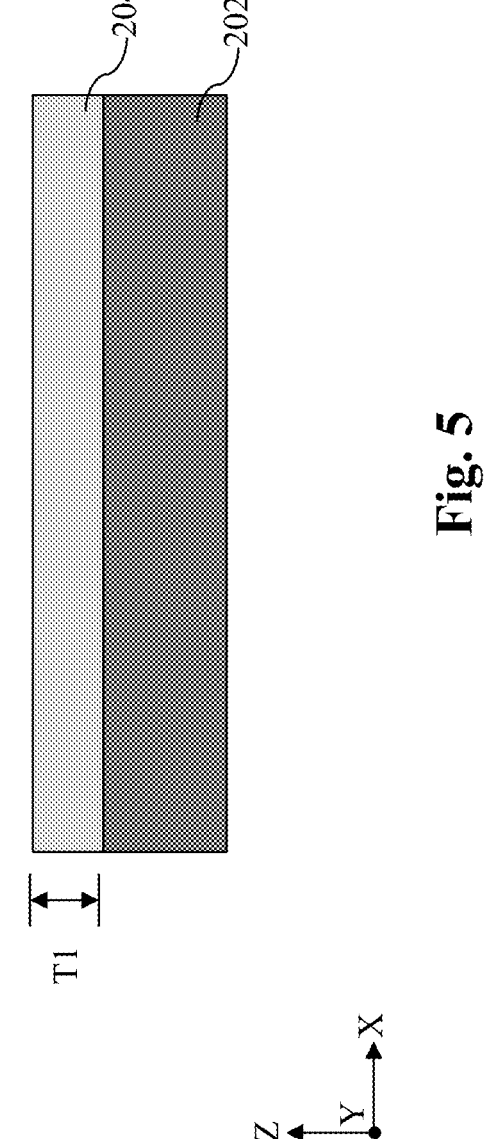

Referring to FIGS. 2 and 5, the first sub-process 14A includes a block 102 where a base buffer layer 204 is deposited over the substrate 202. In some embodiments, the base buffer layer 204 includes aluminum nitride (AlN). The base buffer layer 204 may be deposited using physical vapor deposition (PVD). In an example process, the base buffer layer 204 is deposited in a PVD chamber using an aluminum target and a flow of a nitrogen-containing gas, such as nitrogen (N$_2$). In some implementations, the PVD process for depositing the base buffer layer 204 may be pulse DC sputtering or sputtering with a radio frequency (RF) biasing. According to the present disclosure, it is desirable for the base buffer layer 204 to possess high crystallinity in order for the base buffer layer 204 to exhibit good thermal conductivity. In order to achieve that, the PVD process at block 102 is performed at a low temperature, such as between about 20° C. and about 200° C., and a low pressure, such as between about 1 Torr and about 3 Torr. In some instances, the base buffer layer 204 formed under the aforementioned conditions may have a thermal conductivity of between about 230 W/mK and about 320 W/mK at room temperature. It is noted that having a buffer layer with high crystallinity is considered by some conventional wisdom as undesirable as high crystallinity often leads to high electron leakage. In some embodiments, the base buffer layer 204 may have a first thickness T1 as measured from a top surface of the substrate 202. In some embodiments, the first thickness T1 may be between about 55 Å and about 95 Å. The subsequent block 104 forms a leakage reduction layer 206 to reduce electron leakage.

Figure 6:
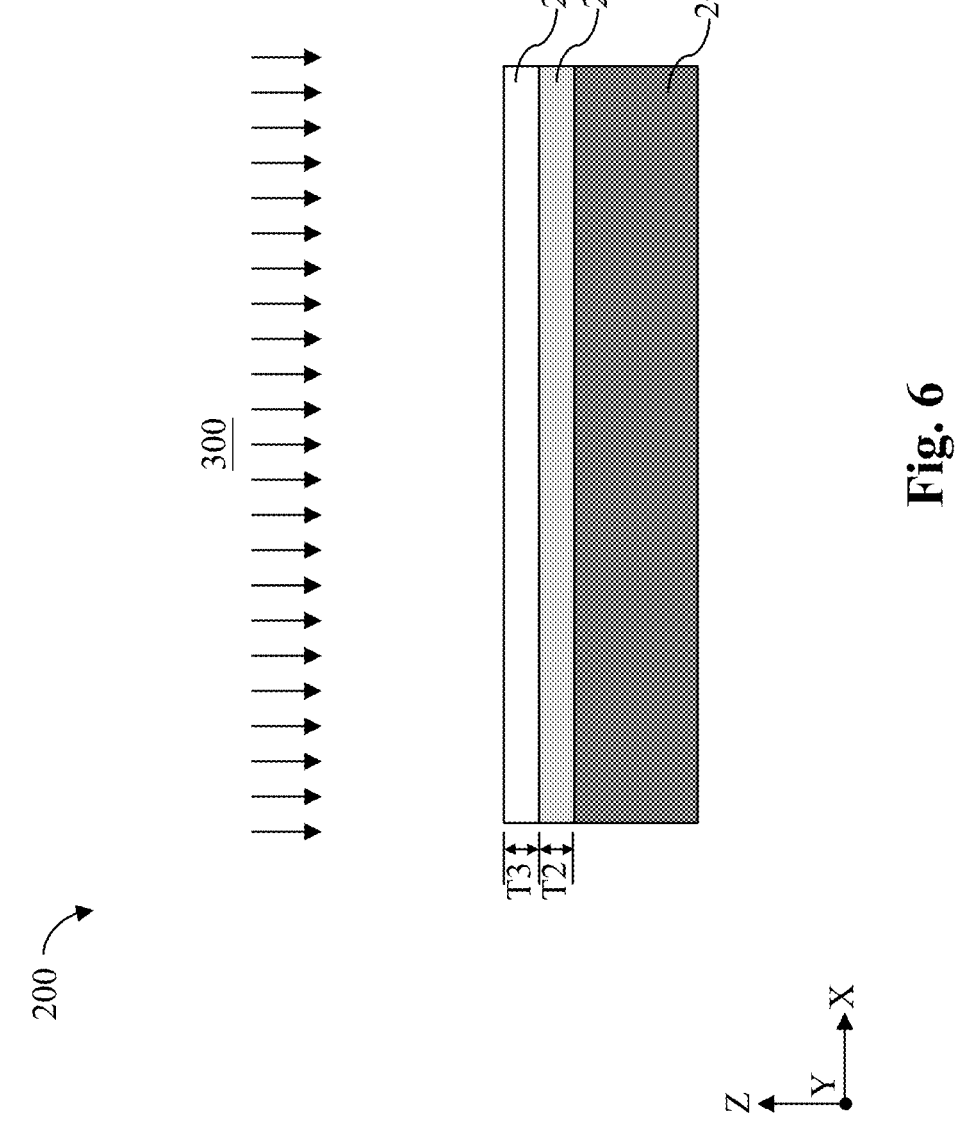

Referring to FIGS. 2 and 6, the first sub-process 14A includes a block 104 where a treatment 300 is performed to convert a top portion of the base buffer layer 204 into a leakage reduction layer 206. In some embodiments, the leakage reduction layer 206 includes aluminum oxynitride (AlON), which may be considered a partially oxidized form of the base buffer layer 204 or an oxygen-doped form of the base buffer layer 204. In one embodiment, the treatment 300 includes a nitrous oxide (N$_2$O) plasma treatment. In this embodiment, the nitrous oxide (N$_2$O) plasma treatment introduces oxygen into the top portion of the base buffer layer 204 and converts it into the leakage reduction layer 206. In some implementations, the nitrous oxide (N$_2$O) plasma treatment may include use of a dual frequency plasma source with a primary high frequency between about 200 MHz and about 600 MHz and a secondary low frequency between about 50 MHz and about 300 MHz. In some instances, the nitrous oxide plasma treatment may last between 1 and about 15 seconds. In another embodiment, the treatment 300 includes an ultraviolet (UV) treatment in an ambient of an inert gas, such as argon (Ar), helium (He), or a combination of both. In this embodiment, the UV treatment may remove defects in the base buffer layer 204. After the UV treatment, the treated base buffer layer 204 is exposed to ambient air and the oxygen ($O_2$) in ambient air may be incorporated into the top portion of the base buffer layer 204 to form the leakage reduction layer 206. In yet another embodiment, the treatment 300 may include both the UV treatment and the nitrous oxide ($N_2O$) plasma treatment. The former removes defects in the base buffer layer 204 and the latter converts the top portion of the base buffer layer 204 into a leakage reduction layer. Compared to the base buffer layer 204 that includes AlN, the leakage reduction layer 206, which includes aluminum oxynitride (AlON), is less crystalline and exhibits a low electron leakage. The treatment 300 may be regarded as an oxygen doping process and the oxygen doping impacts lattice thermal conductivity due to additional phonon-scattering. To prevent the leakage reduction layer 206 from slowing down the thermal conduction too much, a second thickness T2 of the leftover base buffer layer 204 is greater than a third thickness T3 of the leakage reduction layer 206. In some embodiments, the second thickness T2 may be between about 40 Å and about 60 Å and the third thickness T3 may be between about 20 Å and about 30 Å. The base buffer layer 204 and the leakage reduction layer 206 may be collectively referred to as a first buffer layer pair 208.

Figure 7:
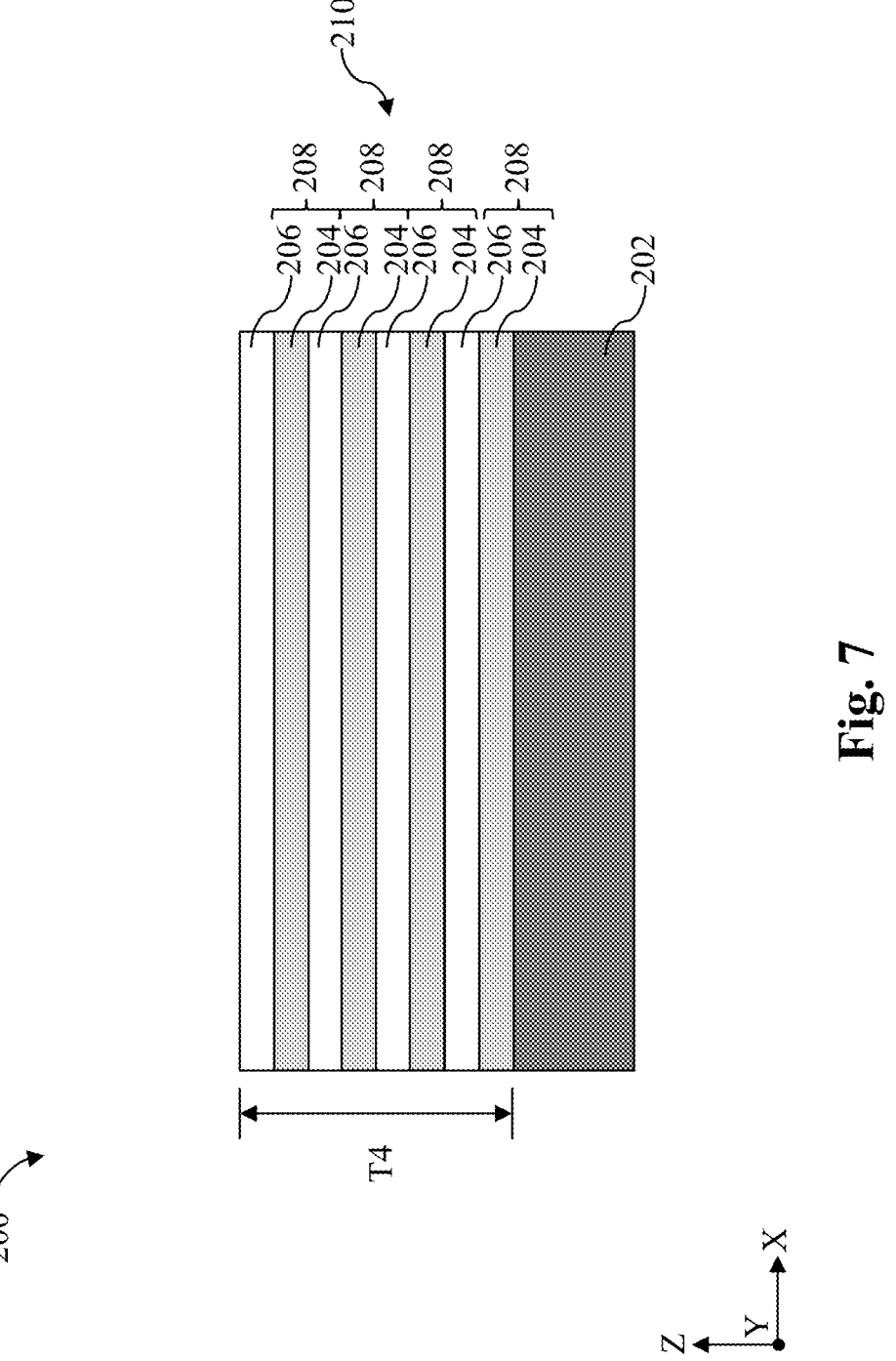

Referring to FIGS. 2 and 7, the first sub-process 14A includes a block 106 to determine if the deposited first buffer layer pair(s) 208 have reached a desired thickness. In the depicted embodiment, the desired thickness a fourth thickness T4. In some instances, the fourth thickness T4 may between about 150 Å and about 200 Å. When the desired thickness is not reached, operations at blocks 102 and 104 are repeated to form additional first buffer layer pairs 208. In this regard, it can be seen that operations at blocks 102 and 104 may be regarded as a cycle that can be repeated to reach the desired thickness. In some instances, the cycle that includes operations at blocks 102 and 104 may be performed once or repeated 1 to 10 times. The final stack of first buffer layer pair 208 may be referred to as a first multilayer buffer layer 210. When the cycle is only performed once, the first multilayer buffer layer 210 includes one base buffer layer 204 and one leakage reduction layer 206 and is a first buffer layer pair 208. For illustration purposes but not to limit the scope of the present disclosure, the first multilayer buffer layer 210 shown in FIG. 7 includes four (4) first buffer layer pairs 208.

Figure 3:
FIG. 3 illustrates a flow chart of a second sub-process for depositing a buffer layer at block 14 of the method in FIG. 1, according to one or more aspects of the present disclosure.
Figure 3:
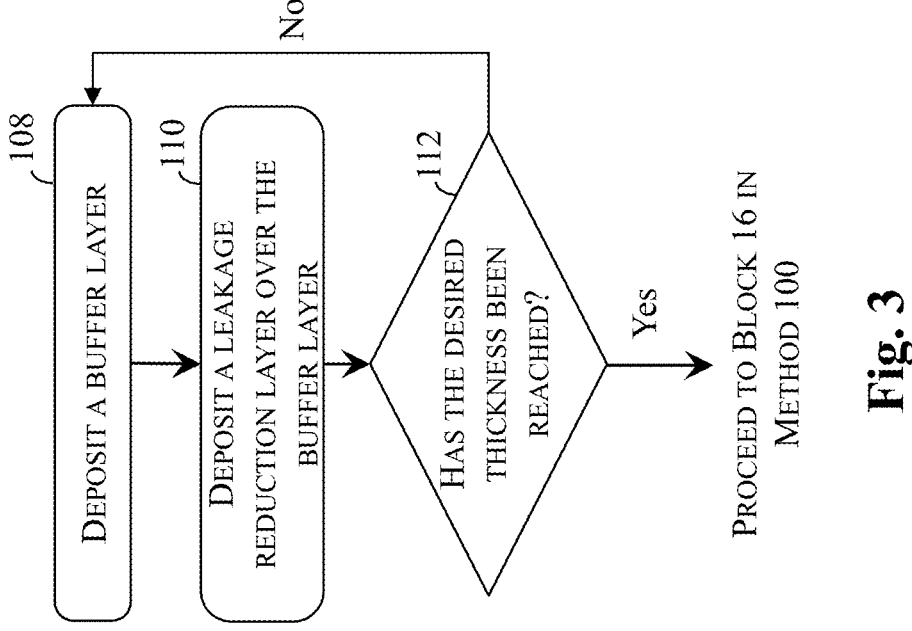
Figure 12:
Figure 12:
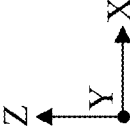

Referring to FIGS. 3 and 12, the second sub-process 14B includes a block 108 where a buffer layer 212 is deposited over the substrate 202. In some embodiments, the buffer layer 212 includes aluminum nitride (AlN) or boron nitride (BN). The buffer layer 212 may be deposited using atomic layer deposition (ALD) or chemical vapor deposition (CVD). When the buffer layer 212 include aluminum nitride, the deposition at block 108 may include use of an aluminum-containing precursor and a nitrogen-containing precursor. Example aluminum-containing precursors may include trimethylaluminium (TMA) or triethylaluminium (TEA). Example nitrogen-containing precursors may include ammonia ($NH_3$), tertiarybutylamine (TBAm), or phenyl hydrazine. When the buffer layer 212 includes boron nitride (BN), the deposition at block 108 may include use of a single precursor or a combination of a boron-containing precursor and a nitrogen-containing precursor. Examples of the single precursor include ammonia borane, borazine, and trimethylamine borane. Examples of the boron-containing precursor include boron trifluoride, boric oxide, boron trichloride, trimethylborate (TMB), diborate, or decaborane. Example nitrogen-containing precursors may include ammonia ($NH_3$), tertiarybutylamine (TBAm), or phenyl hydrazine. According to the present disclosure, it is desirable for the buffer layer 212 to possess high crystallinity in order for the buffer layer 212 to exhibit good thermal conductivity. In some instances, the buffer layer 212 may have a thermal conductivity of between about 230 W/mK and about 320 W/mK at room temperature when it includes aluminum nitride and a thermal conductivity greater than 600 W/mk when it includes boron nitride. As described above, having a buffer layer with high crystallinity is considered by some conventional wisdom as undesirable as high crystallinity often leads to high electron leakage. In some embodiments, the buffer layer 212 may have a second thickness T2 as measured from a top surface of the substrate 202. In some embodiments, the second thickness T2 may be between about 40 Å and about 60 Å and the third thickness T3 may be between about 20 Å and about 40 Å. The subsequent block 110 forms a leakage reduction layer 214 to reduce electron leakage.

Figure 13:
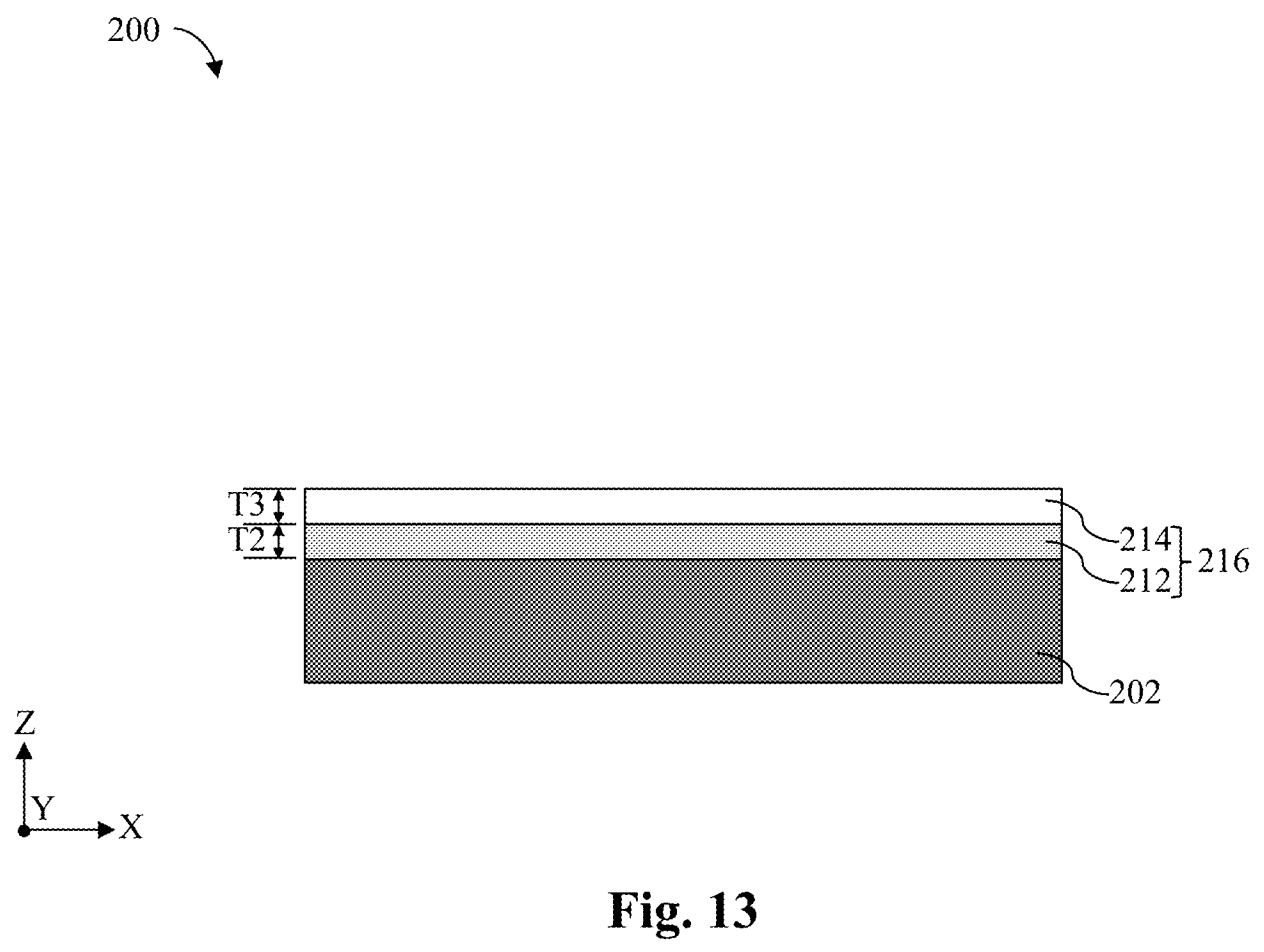

Referring to FIGS. 3 and 13, the second sub-process 14B includes a block 110 where a leakage reduction layer 214 is deposited over the buffer layer 212. In some embodiments, the leakage reduction layer 214 may include aluminum oxynitride (AlON) or gallium nitride (GaN). Different from the leakage reduction layer 206 that is formed from the treatment 300 in the first sub-process 16A, the leakage reduction layer 214 is deposited using ALD or CVD. Because operations at block 108 and 110 are performed using ALD or CVD, deposition of the buffer layer 212 and the leakage reduction layer 214 may be deposited in the same process chamber without breaking the vacuum. If one of the buffer layer 212 and the leakage reduction layer 214 is deposited using a different deposition method, such as PVD, the workpiece 200 will have to be moved in and out of the CVD and PVD chamber, resulting in increased process time. When the leakage reduction layer 214 includes aluminum oxynitride, the deposition at block 110 may include an aluminum-containing precursor, an oxygen-containing precursor, and a nitrogen-containing precursor. Example oxygen-containing precursors may include oxygen ($O_2$) or nitrous oxide ($N_2O$). Example aluminum-containing precursors may include trimethylaluminium (TMA) or triethylaluminium (TEA). Example nitrogen-containing precursors may include ammonia ($NH_3$), tertiarybutylamine (TBAm), or phenyl hydrazine. When the leakage reduction layer 214 includes gallium nitride, the deposition at block 110 may include a gallium-containing precursor and a nitrogen-containing precursor. Examples of the gallium-containing precursor include trimethylgallium (TMG) and triethylgallium (TEG). Examples of the nitrogen-containing precursor include ammonia ($NH_3$), tertiarybutylamine (TBAm), or phenyl hydrazine. To prevent the leakage reduction layer 214 from slowing down the thermal conduction too much, the second thickness T2 of the buffer layer 212 is greater than a third thickness T3 of the leakage reduction layer 214. In some embodiments, the second thickness T2 may be between about 40 Å and about 60 Å and the third thickness T3 may be between about 20 Å and about 40 Å. The buffer layer 212 and the leakage reduction layer 214 may be collectively referred to as a second buffer layer pair 216.

Figure 14:
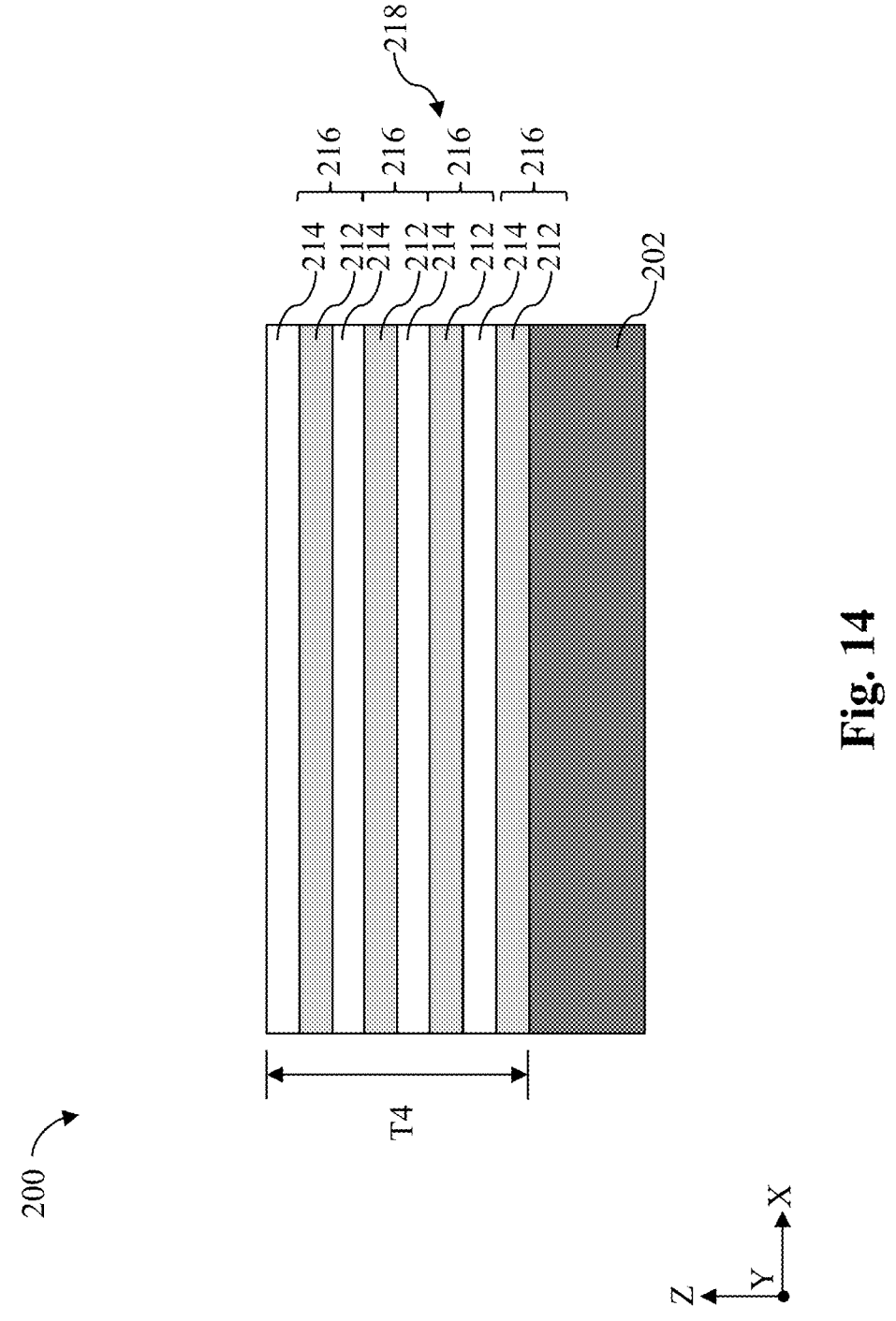

Referring to FIGS. 3 and 14, the second sub-process 14B includes a block 112 to determine if the deposited second buffer layer pair(s) 216 have reached a desired thickness. In the depicted embodiment, the desired thickness a fourth thickness T4. In some instances, the fourth thickness T4 may between about 150 Å and about 200 Å. When the desired thickness is not reached, operations at blocks 108 and 110 are repeated to form additional second buffer layer pairs 216. In this regard, it can be seen that operations at blocks 108 and 110 may be regarded as a cycle that can be repeated to reach the desired thickness. In some instances, the cycle that includes operations at blocks 108 and 110 may be performed once or repeated 1 to 10 times. The final stack of second buffer layer pair 216 may be referred to as a second multilayer buffer layer 218. When the cycle is only performed once, the second multilayer buffer layer 218 includes one buffer layer 212 and one leakage reduction layer 214 and is a second buffer layer pair 216. For illustration purposes but not to limit the scope of the present disclosure, the second multilayer buffer layer 218 shown in FIG. 13 includes four (4) second buffer layer pairs 216.

The first sub-process 14A and the second sub-process 14B have different attributes. The first sub-process 14A deposits the base buffer layer 204 by PVD and forms the leakage reduction layer 206 by treating a top portion of the base buffer layer 204. The second sub-process 14B deposits both the buffer layer 212 and the leakage reduction layer 214 by ALD or CVD. Both the first sub-process 14A and the second sub-process 14B may achieve the intended results. Because PVD has a much higher deposition rate than ALD or CVD, the first sub-process 14A has a shorter process time than the second sub-process 14B. In semiconductor fabrication, process time, also referred to as takt time, determines a throughput of the process. Generally, a shorter process time may translate into lower manufacturing cost. That is, the first sub-process 14A may be more cost friendly than the second sub-process 14A. The second sub-process 14B has advantages too. Because the leakage reduction layer 206 in the first sub-process 14A is formed by treating the base buffer layer 204, the leakage reduction layer 206 is an altered form or a doped form of the base buffer layer 204. However, because the second sub-process 14B forms the buffer layer 212 and the leakage reduction layers 214 anew, the buffer layer 212 and the leakage reduction layers 214 can be more different in terms of composition. For example, when the second sub-process 14B is adopted, the buffer layer 212 may include aluminum nitride (AlN) and the leakage reduction layer 214 may include gallium nitride (GaN), which is not an altered or a doped form of aluminum nitride (AlN). For another example, when the second sub-process 14B is adopted, the buffer layer 212 may include boron nitride (BN) and the leakage reduction layer 214 may include aluminum oxynitride (AlON), which is not an altered or a doped form of BN. In other words, the second sub-process 14B may be used to form a wider variety of buffer layer pairs than the first sub-process 14A. In a first example, the second multilayer buffer layer 218 may include buffer layers 212 that are formed of crystalline aluminum nitride (AlN) and leakage reduction layers 214 are formed of aluminum oxynitride (AlON). In a second example, the second multilayer buffer layer 218 may include buffer layers 212 that are formed of crystalline boron nitride (BN) and leakage reduction layers 214 are formed of aluminum oxynitride (AlON). In a third example, the second multilayer buffer layer 218 may include buffer layers 212 that are formed of crystalline aluminum nitride (AlN) and leakage reduction layers 214 are formed of gallium nitride (GaN). In a fourth example, the second multilayer buffer layer 218 may include buffer layers 212 that are formed of crystalline boron nitride (BN) and leakage reduction layers 214 are formed of gallium nitride (GaN).

Figure 8:
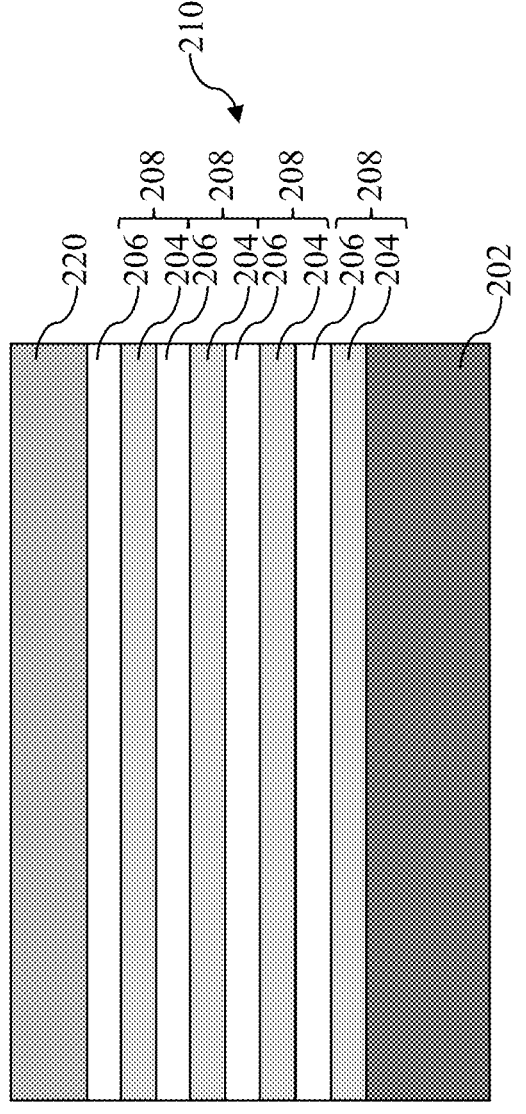
Figure 15:
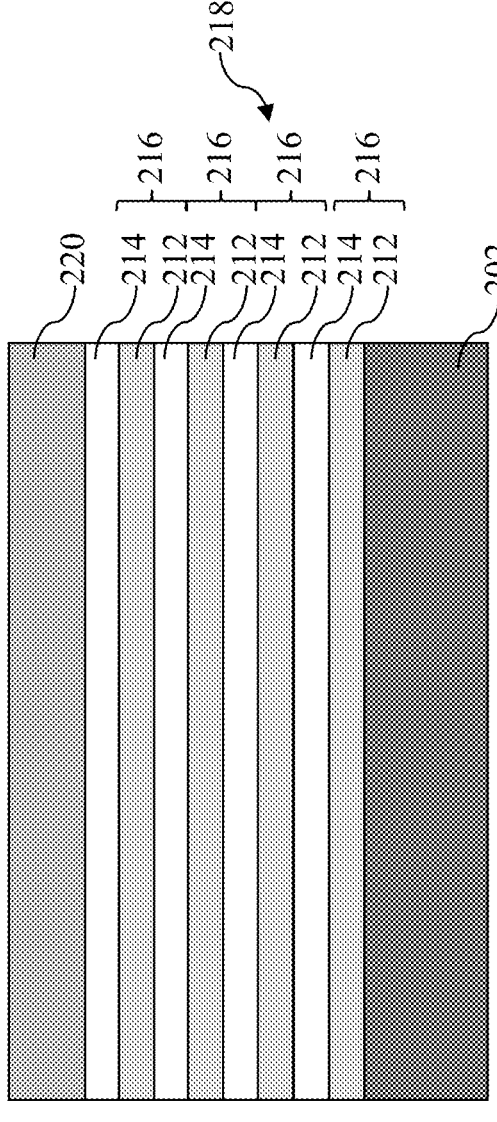

Referring to FIGS. 1, 8 and 15, method 10 includes a block 16 where a channel layer 220 is deposited over the buffer layer. The channel layer 220 includes a III-V semiconductor. In one embodiments, the channel layer 220 may include gallium nitride (GaN). When the channel layer 220 includes gallium nitride, it may be deposited using PVD, sputter epitaxy, metal organic vapor phase epitaxy (MOVPE), metal organic chemical vapor deposition (MOCVD), CVD, or ALD. When the channel layer 220 is deposited using PVD, a high purity gallium nitride sputtering target may be used. When the channel layer 220 is deposited using sputtering epitaxy, a gallium sputtering target may be sputtered with nitrogen plasma. When the channel layer 220 is deposited using MOVPE, MOCVD, CVD or ALD, the deposition at block 16 may include a gallium-containing precursor and a nitrogen-containing precursor. Examples of the gallium-containing precursor include trimethylgallium (TMG) and triethylgallium (TEG). Examples of the nitrogen-containing precursor include ammonia ($NH_3$), tertiarybutylamine (TBAm), or phenyl hydrazine.

In some alternative embodiments, the channel layer 220 may include aluminum nitride (AlN) or aluminum gallium nitride (AlGaN). When the channel layer 220 includes aluminum nitride, it may be deposited using PVD, sputter epitaxy, metal organic vapor phase epitaxy (MOVPE), metal organic chemical vapor deposition (MOCVD), CVD, or ALD. For example, when the channel layer 220 includes aluminum nitride, its deposition may include use of an aluminum-containing precursor and a nitrogen-containing precursor. Example aluminum-containing precursors may include trimethylaluminium (TMA) or triethylaluminium (TEA). Example nitrogen-containing precursors may include ammonia ($NH_3$), tertiarybutylamine (TBAm), or phenyl hydrazine. When the channel layer 220 includes aluminum gallium nitride, its deposition may also include use of a gallium-containing precursor. Examples of the gallium-containing precursor include trimethylgallium (TMG) and triethylgallium (TEG). It is noted that when both the channel layer 220 and the barrier layer 230 (to be described below) include aluminum gallium nitride, they have different stoichiometric ratios. For example, the channel layer 220 may include more gallium (Ga) and less aluminum (Al) than the barrier layer 230. FIG. 8 illustrates a channel layer 220 deposited on the first multilayer buffer layer 210. FIG. 15 illustrates a channel layer 220 deposited on the second multilayer buffer layer 218.

Figure 9:
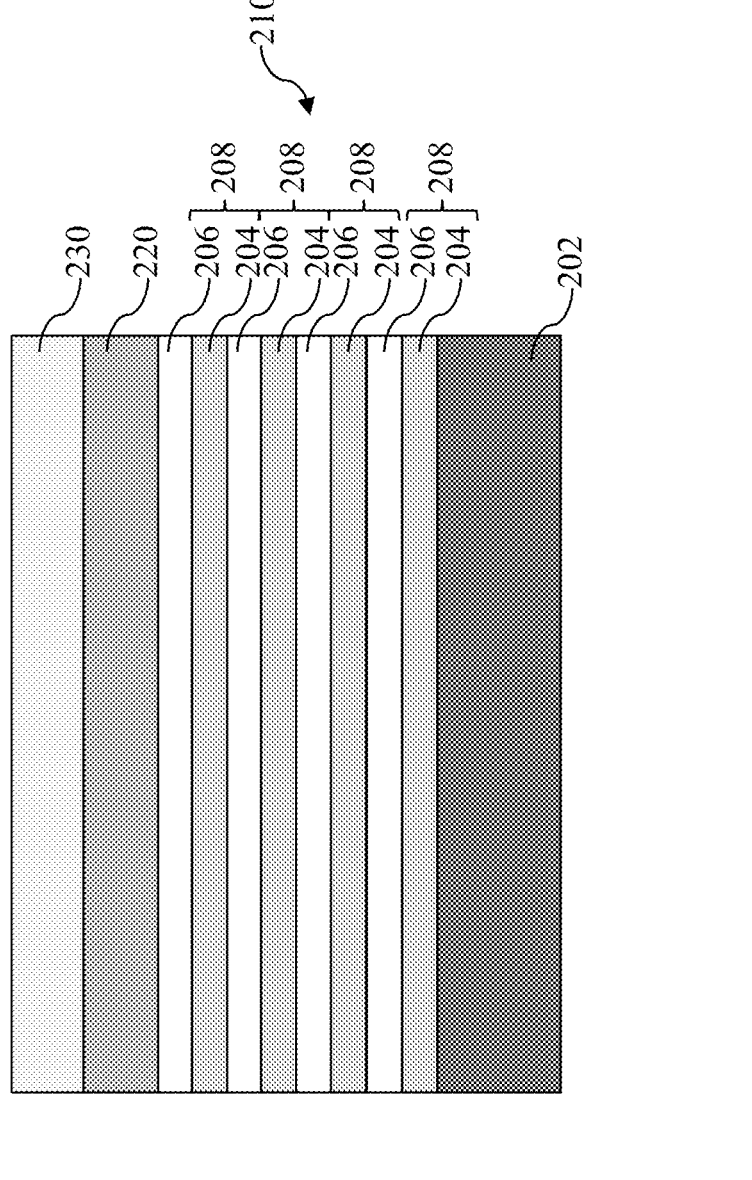
Figure 10:
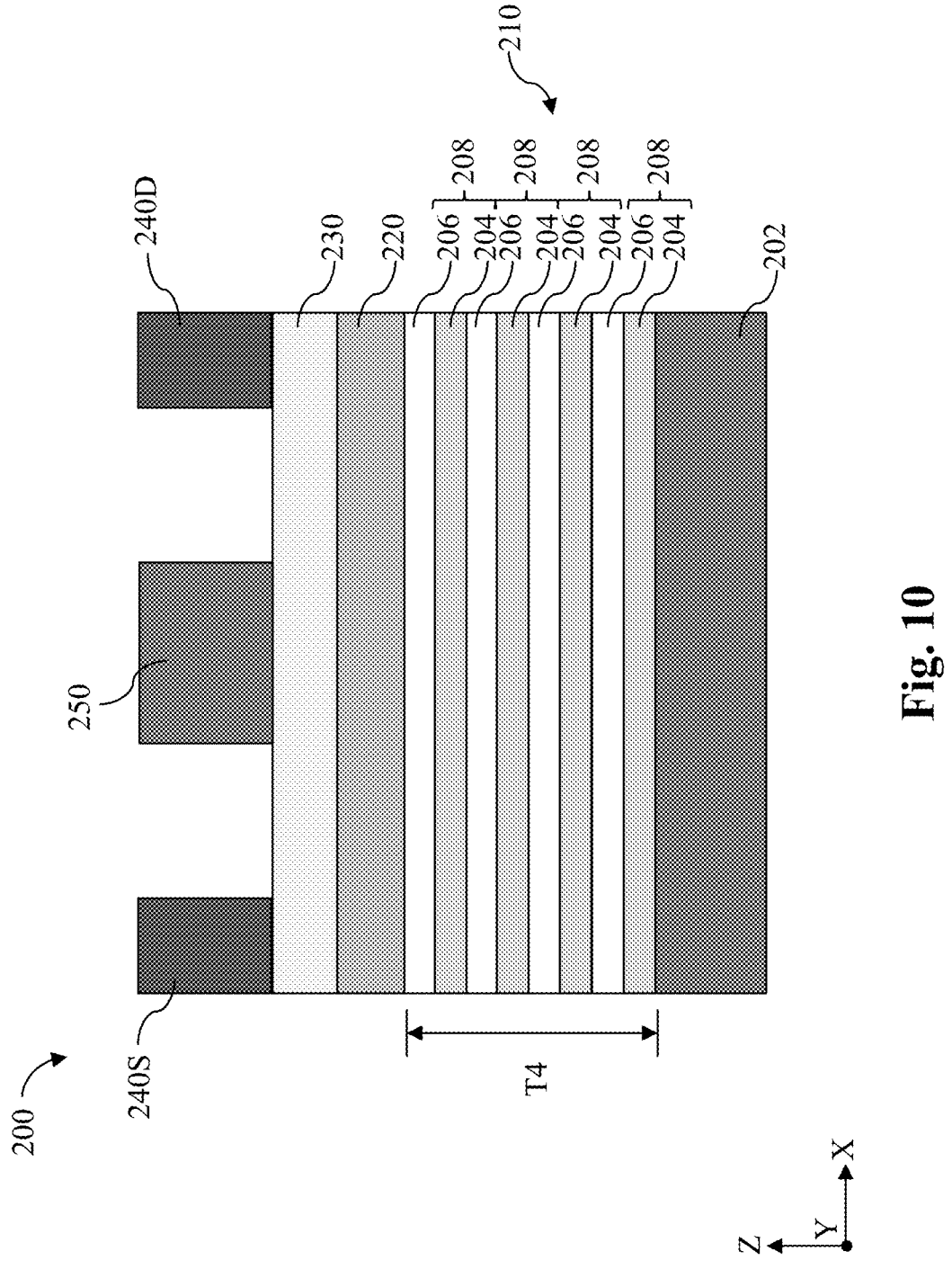
Figure 11:
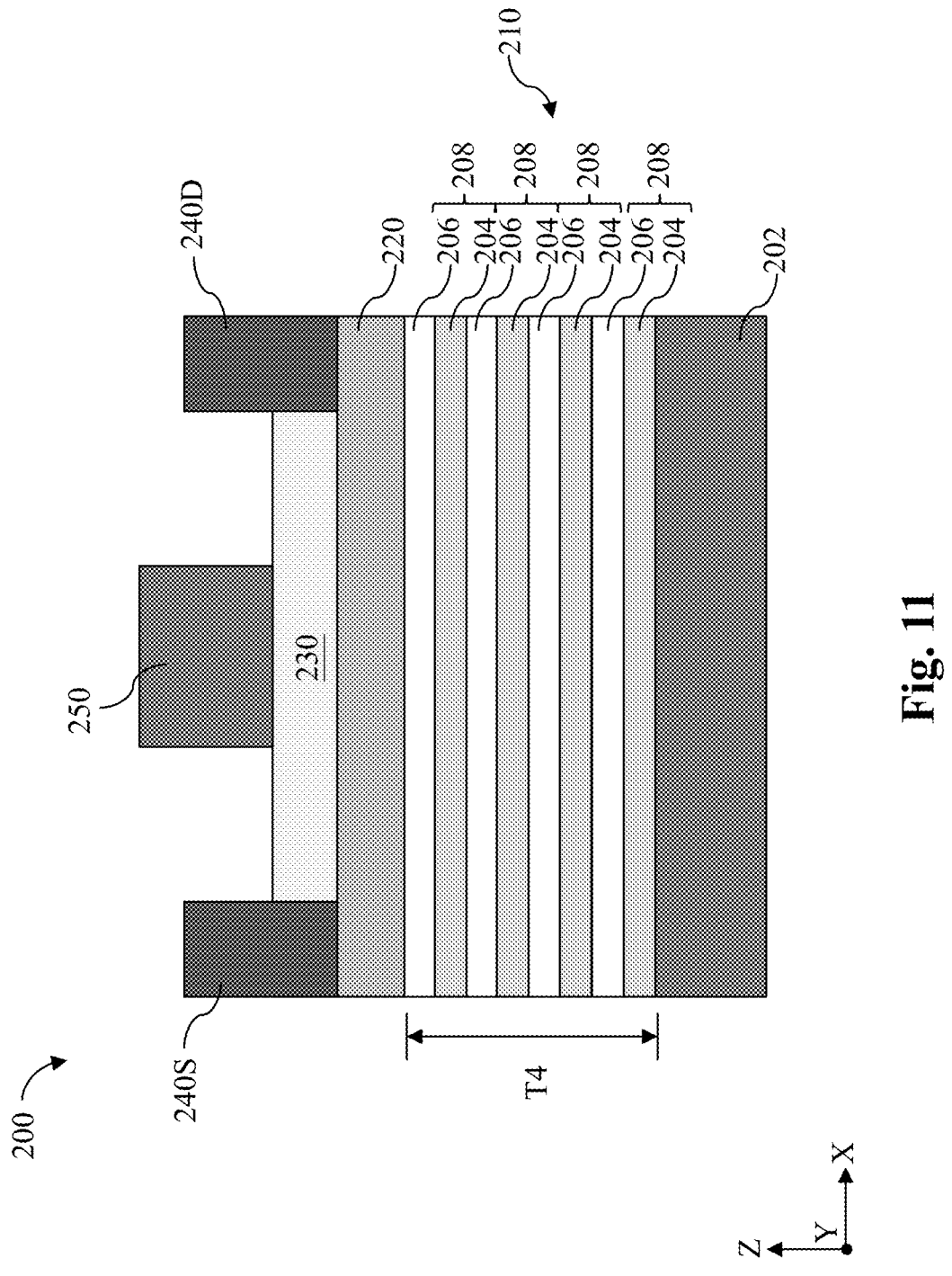
Figure 16:
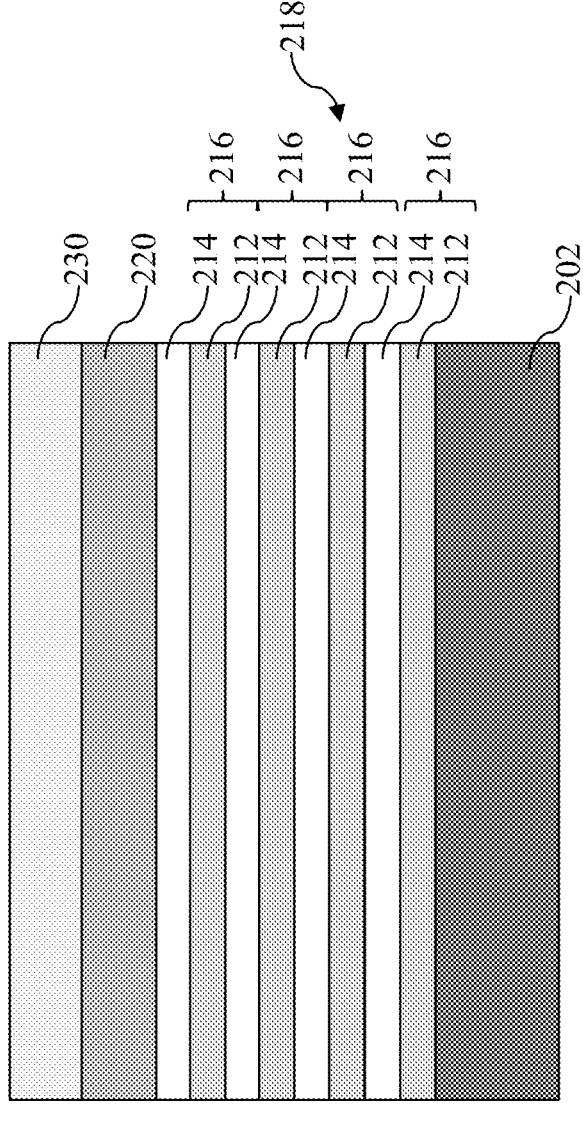
Figure 17:
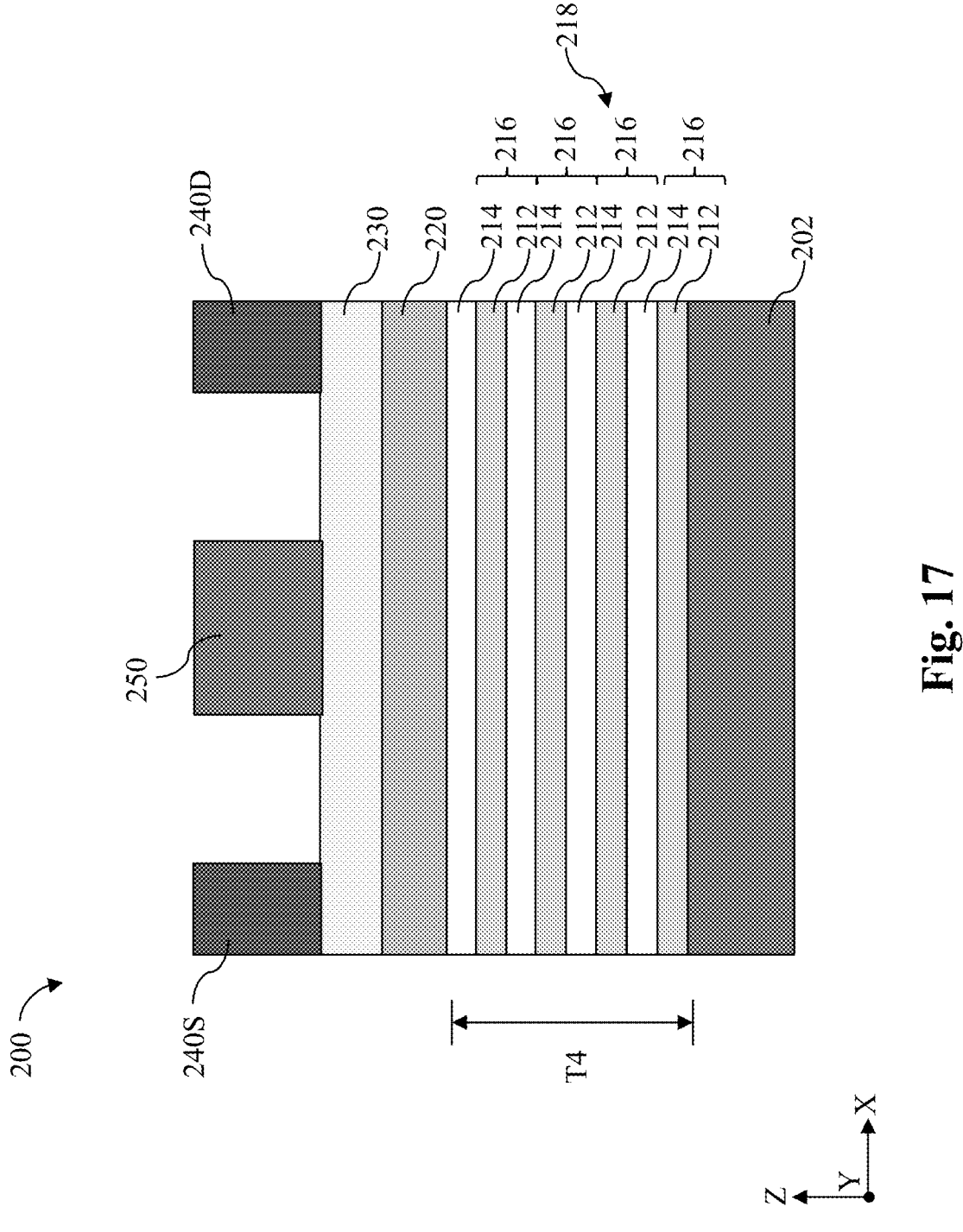
Figure 18:
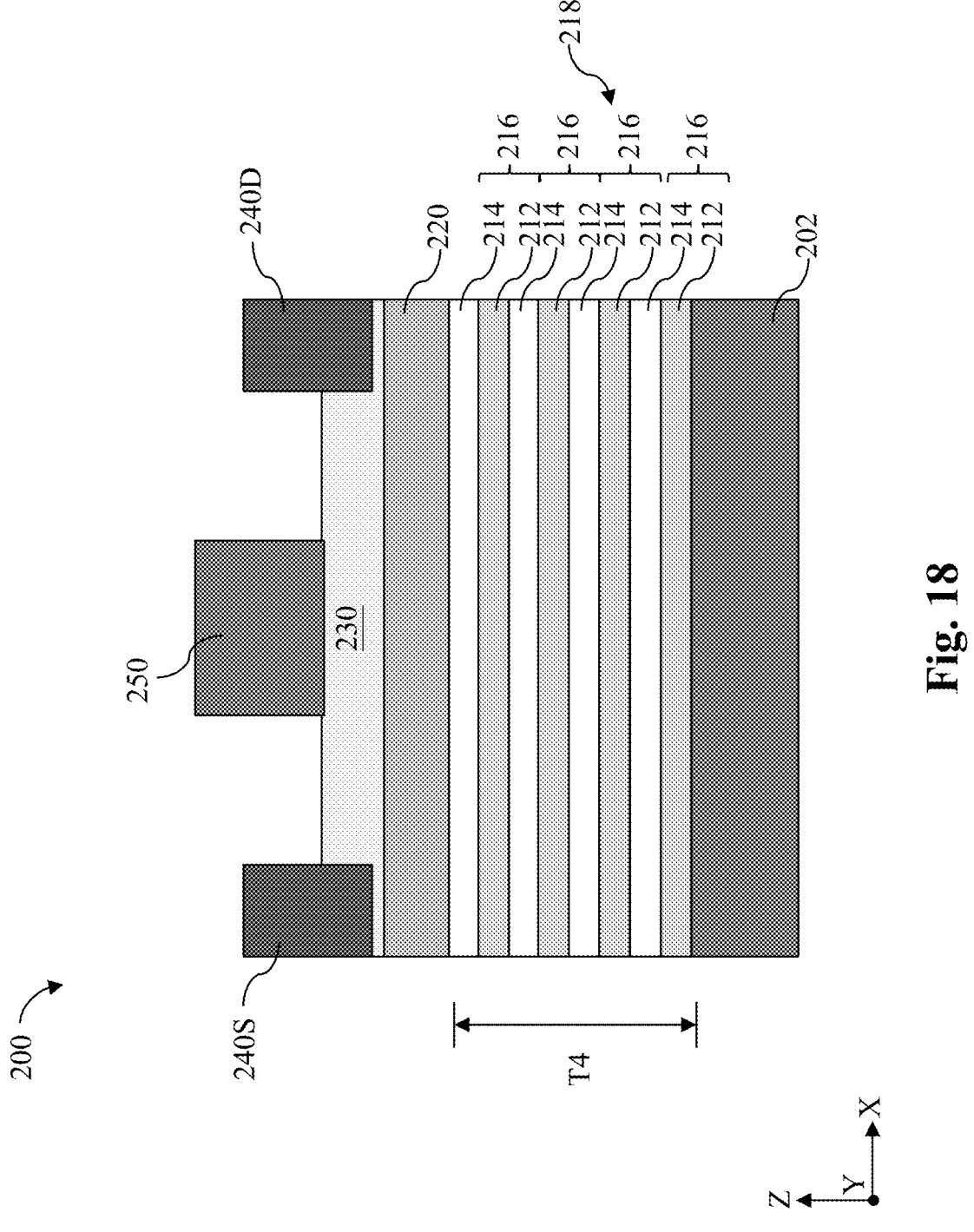

Referring to FIGS. 1, 9 and 16, method 10 includes a block 18 where a barrier layer 230 is deposited over the channel layer 220. In some embodiments, the barrier layer 230 may include aluminum gallium nitride (AlGaN). The barrier layer 230 can be epitaxially grown by MOVPE using an aluminum-containing precursor, a gallium-containing precursor, and a nitrogen-containing precursor. The aluminum-containing precursor may include TMA or TEA. The gallium-containing precursor includes TMG or TEG. The nitrogen-containing precursor includes ammonia ($NH_3$), tertiarybutylamine (TBAm), or phenyl hydrazine. FIG. 9 illustrates a barrier layer 230 deposited on the channel layer 220, which is deposited directly on the first multilayer buffer layer 210. FIG. 16 illustrates a barrier layer 230 deposited on the channel layer 220, which is on the second multilayer buffer layer 218.

Referring to FIGS. 1, 10-11 and 17-18, method 10 includes a block 20 where a source contact 240S and a drain contact 240D are formed over the barrier layer 230. In some embodiments, the source contact 240S and the drain contact 240D include tantalum nitride (TaN), nickel (Ni), molybdenum (Mo), copper (Cu), tungsten (W), aluminum (Al), cobalt (Co), zirconium (Zr), platinum (Pt), gold (Au), or a combination thereof. The source contact 240S and the drain contact 240D may be deposited separately or simultaneously using PVD, CVD or MOCVD. In some embodiments, after the formation of the source contact 240S and the drain contact 240D, an anneal is performed to cause the source contact 240S and the drain contact 240D to form an alloy with the barrier layer 230. In some embodiments illustrated in FIGS. 10 and 17, the source contact 240S and the drain contact 240D are disposed directly on a top surface of the barrier layer. In some alternative embodiments illustrated in FIGS. 11 and 18, the barrier layer 230 is first etched to form recesses into the barrier layer 230 and then the source contact 240S and the drain contact 240D are deposited in the recesses. In still some embodiments, the recesses formed in the barrier layer 230 extend completely through the barrier layer 230 to expose the channel layer 220 and the source contact 240S and the drain contact 240D contact the barrier layer 230 by their sidewalls only. In these embodiments, bottom surfaces of the source contact 240S and the drain contact 240D are in contact with the channel layer 220.

Referring to FIGS. 1, 10-11 and 17-18, method 10 includes a block 22 where a gate structure 250 is formed over the barrier layer 230. While not explicitly shown in the figures, the gate structure 250 may include more than one layer. In one embodiment, the gate structure 250 may include a junction isolation layer directly on the barrier layer 230 and a gate electrode directly on the junction isolation layer. In some embodiments, the junction isolation layer may include aluminum oxide or silicon nitride. In some embodiments, the gate electrode may include tantalum nitride (TaN), nickel (Ni), molybdenum (Mo), copper (Cu), tungsten (W), aluminum (Al), cobalt (Co), zirconium (Zr), platinum (Pt), gold (Au), or a combination thereof. The junction isolation layer may be deposited using ALD or CVD. The gate electrode may be deposited using PVD, CVD or MOCVD.

Upon completion of the operations at block 22, a semiconductor device 200 is formed out of the workpiece 200, as shown in FIGS. 10, 11, 17, and 18. The semiconductor device 200 may be a high electron mobility transistor (HEMT). In some implementations, the semiconductor device 200 is an enhancement mode HEMT where the channel in the channel layer 220 is normally off when no bias voltage is applied to the gate structure 250.

The present disclosure provides a multilayer buffer layer for a HEMT. The multilayer buffer layer includes 1 to 10 pairs of crystalline buffer layer and leakage reduction layer. Out of each pair, the crystalline buffer layer provides thermal conductivity and the leakage reduction layer functions to reduce electron leakage. In one embodiment, a base buffer layer 204 is deposited over a substrate 202 using PVD. With low process pressure and low process temperature, the base buffer layer 204 as deposited exhibit crystallinity. The treatment 300 is performed to the base buffer layer 204 to convert a top portion of the base buffer layer 204 into a leakage reduction layer 206. The treatment 300 may include a nitrous oxide plasma treatment, a UV treatment followed by exposure to air, or both. The treatment 300 introduces oxygen into the lattice of the top portion of the base buffer layer 204. Due to the introduction of oxygen, the leakage reduction layer 206 has a thermal conductivity smaller than that of the base buffer layer 204. To prevent the leakage reduction layer 206 from reducing the thermal conductivity too much, its thickness is smaller than a thickness of the base buffer layer 204. In some embodiments, the base buffer layer 204 includes aluminum nitride (AlN) and the leakage reduction layer 206 includes aluminum oxynitride (AlON) or oxygen-doped aluminum nitride (AlN:O). A first multilayer buffer layer 210 may include one (1) to ten (10) pairs of the base buffer layer 204 and the leakage reduction layer 206. In another embodiment, a buffer layer 212 and a leakage reduction layer 214 are deposited by ALD or CVD. That is, the leakage reduction layer 214 is not formed by treating a portion of the buffer layer 212. In some embodiments, the buffer layer 212 includes aluminum nitride (AlN) or boron nitride (BN) and the leakage reduction layer (214) includes aluminum oxynitride (AlON) or gallium nitride (GaN). A second multilayer buffer layer 218 may include one (1) to ten (10) pairs of the buffer layer 212 and the leakage reduction layer 214. The first multilayer buffer layer 210 or the second multilayer buffer layer 218 has a thermal conductivity and helps effectively dissipate heat to the substrate 202, thereby slowing down device aging and alleviating thermal performance degradation. The leakage reduction layer in the first multilayer buffer layer 210 or the second multilayer buffer layer 218 reduce electron leakage.

In one exemplary aspect, the present disclosure is directed to a method. The method includes depositing an aluminum nitride layer over a substrate, treating the aluminum nitride layer to convert a top portion of the aluminum nitride layer to an aluminum oxynitride layer, depositing a III-V semiconductor layer on the aluminum oxynitride layer, and forming a gate structure over the III-V semiconductor layer.

In some embodiments, the depositing of the aluminum nitride layer includes use of physical vapor deposition (PVD). In some implementations, the treating includes exposing the aluminum nitride layer to ultraviolet (UV) ray exposure in presence of argon (Ar) or helium (He). In some instances, the treating includes treating the aluminum nitride layer with a nitrous oxide ($N_2O$) plasma. In some embodiments, the method further includes before the forming of the gate structure, forming a source contact and a drain contact through the III-V semiconductor layer. In some embodiments, after the forming of the source contact and the drain contact, the source contact and the drain contact are in direct contact with the aluminum nitride layer. In some implementations, the aluminum nitride layer includes a thickness between about 40 Å and about 60 Å. In some embodiments, the aluminum oxynitride layer includes a thickness between about 20 Å and about 40 Å. In some implementations, the substrate includes silicon, silicon carbide or sapphire.

In another exemplary aspect, the present disclosure is directed to a method. The method includes depositing a multilayer over a substrate, wherein the multilayer includes a plurality of aluminum nitride layers, and a plurality of aluminum oxynitride layers interleaving the plurality of aluminum nitride layers, depositing a III-V semiconductor layer on the aluminum oxynitride layer, forming a gate structure over the III-V semiconductor layer.

In some embodiments, the depositing of the multilayer includes a plurality of process cycles. Each of the plurality of process cycles includes depositing an aluminum nitride layer over the substrate, and treating the aluminum nitride layer to convert a top portion of the aluminum nitride layer to an aluminum oxynitride layer. In some embodiments, the depositing of the aluminum nitride layer includes use of physical vapor deposition (PVD). In some embodiments, the treating includes exposing the aluminum nitride layer to ultraviolet (UV) ray exposure in presence of argon (Ar) or helium (He). In some implementations, the treating includes treating the aluminum nitride layer with a nitrous oxide ($N_2O$) plasma. In some embodiments, a number of the plurality of aluminum nitride layers is the same as a number of the plurality of aluminum oxynitride layers. In some embodiments, the method further includes before the forming of the gate structure, depositing a channel layer over the III-V semiconductor layer. The channel layer includes gallium nitride (GaN), aluminum nitride (AlN), or aluminum gallium nitride (AlGaN). The III-V semiconductor layer includes aluminum gallium nitride (AlGaN).

In yet another exemplary aspect, the present disclosure is directed to a semiconductor device. The semiconductor device includes a substrate, a multilayer disposed over the substrate, the multilayer including a plurality of aluminum nitride layer interleaved by a plurality of aluminum oxynitride layers, a III-V semiconductor layer over the multilayer, and a gate structure over the III-V semiconductor layer.

In some embodiments, the III-V semiconductor layer includes aluminum gallium nitride (AlGaN). In some embodiments, a thickness of each of the plurality of aluminum nitride layers is greater than a thickness of each of the plurality of aluminum oxynitride layers. In some instances, the thickness of each of the plurality of aluminum nitride layers is between about 40 Å and about 60 Å and the thickness of each of the plurality of aluminum oxynitride layers is between about 20 Å and about 40 Å.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
depositing an aluminum nitride layer over a substrate;
treating the aluminum nitride layer to convert a top portion of the aluminum nitride layer to an aluminum oxynitride layer;
depositing a III-V semiconductor layer on the aluminum oxynitride layer; and
forming a gate structure over the III-V semiconductor layer.

2. The method of claim 1, wherein the depositing of the aluminum nitride layer comprises use of physical vapor deposition (PVD).

3. The method of claim 1, wherein the treating comprises exposing the aluminum nitride layer to ultraviolet (UV) ray exposure in presence of argon (Ar) or helium (He).

4. The method of claim 1, wherein the treating comprises treating the aluminum nitride layer with a nitrous oxide ($N_2O$) plasma.

5. The method of claim 1, further comprising:
before the forming of the gate structure, forming a source contact and a drain contact through the III-V semiconductor layer.

6. The method of claim 5, wherein, after the forming of the source contact and the drain contact, the source contact and the drain contact are in direct contact with the aluminum nitride layer.

7. The method of claim 1, wherein the aluminum nitride layer comprises a thickness between about 40 Å and about 60 Å.

8. The method of claim 1, wherein the aluminum oxynitride layer comprises a thickness between about 20 Å and about 40 Å.

9. The method of claim 1, wherein the substrate comprises silicon, silicon carbide or sapphire.

10. A method, comprising:
depositing a multilayer over a substrate, wherein the multilayer comprises:
a plurality of aluminum nitride layers, and
a plurality of aluminum oxynitride layers interleaving the plurality of aluminum nitride layers;
depositing a III-V semiconductor layer on the aluminum oxynitride layer; and
forming a gate structure over the III-V semiconductor layer.

11. The method of claim 10,
wherein the depositing of the multilayer comprises a plurality of process cycles,
wherein each of the plurality of process cycles comprises:
depositing an aluminum nitride layer over the substrate, and
treating the aluminum nitride layer to convert a top portion of the aluminum nitride layer to an aluminum oxynitride layer.

12. The method of claim 11, wherein the depositing of the aluminum nitride layer comprises use of physical vapor deposition (PVD).

13. The method of claim 11, wherein the treating comprises exposing the aluminum nitride layer to ultraviolet (UV) ray exposure in presence of argon (Ar) or helium (He).

14. The method of claim 11, wherein the treating comprises treating the aluminum nitride layer with a nitrous oxide ($N_2O$) plasma.

15. The method of claim 11, wherein a number of the plurality of aluminum nitride layers is the same as a number of the plurality of aluminum oxynitride layers.

16. The method of claim 11, further comprising:
before the forming of the gate structure, depositing a channel layer over the III-V semiconductor layer,
wherein the channel layer comprises gallium nitride (GaN), aluminum nitride (AlN), or aluminum gallium nitride (AlGaN),
wherein the III-V semiconductor layer comprises aluminum gallium nitride (AlGaN).

17. A semiconductor device, comprising:
a substrate;
a multilayer disposed over the substrate, the multilayer comprising a plurality of aluminum nitride layer interleaved by a plurality of aluminum oxynitride layers;
a III-V semiconductor layer over the multilayer; and
a gate structure over the III-V semiconductor layer.

18. The semiconductor device of claim 17, wherein the III-V semiconductor layer comprises aluminum gallium nitride (AlGaN).

19. The semiconductor device of claim 17, wherein a thickness of each of the plurality of aluminum nitride layers is greater than a thickness of each of the plurality of aluminum oxynitride layers.

20. The semiconductor device of claim 19,
wherein the thickness of each of the plurality of aluminum
nitride layers is between about 40 Å and about 60 Å,
wherein the thickness of each of the plurality of aluminum
oxynitride layers is between about 20 Å and about 40
Å.

* * * * *